Figure 1:
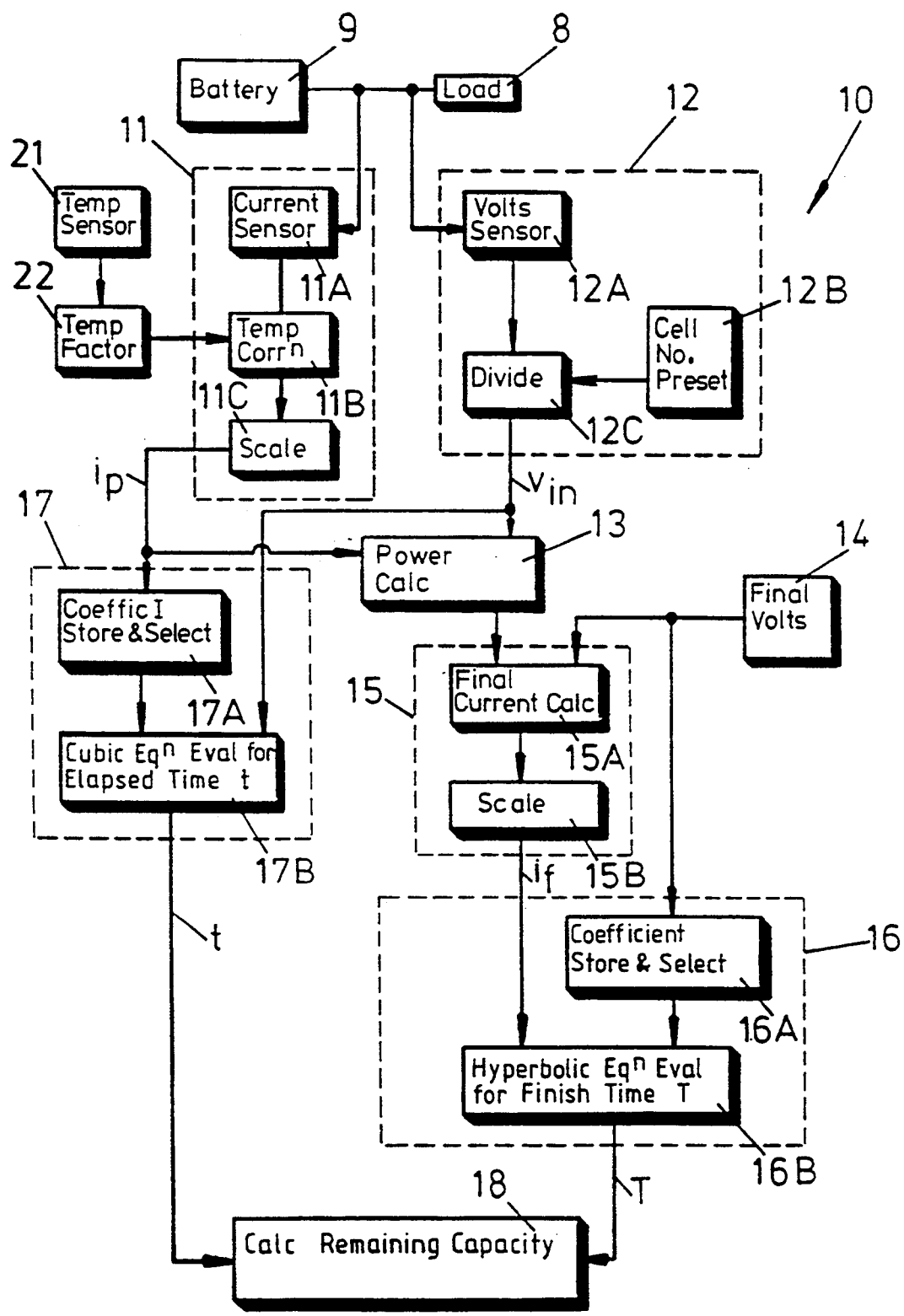

United States Patent [19]

Clegg

[11] Patent Number: 5,394,089
[45] Date of Patent: Feb. 28, 1995

[54] BATTERY MONITOR WHICH INDICATES REMAINING CAPACITY BY CONTINUOUSLY MONITORING INSTANTANEOUS POWER CONSUMPTION RELATIVE TO EXPECTED HYPERBOLIC DISCHARGE RATES

[75] Inventor: Andrew S. Clegg, Chippenham, England

[73] Assignee: Opalport Electronics Limited, Wiltshire, England

[21] Appl. No.: 150,278

[22] PCT Filed: Nov. 29, 1989

[86] PCT No.: PCT/GB89/01428

§ 371 Date: May 29, 1992

§ 102(e) Date: May 29, 1992

[87] PCT Pub. No.: WO91/08494

PCT Pub. Date: Jun. 13, 1991

Related U.S. Application Data

[63] Continuation of Ser. No. 852,193, May 29, 1992, abandoned.

[51] Int. Cl.⁶ ............................................. G01R 31/36
[52] U.S. Cl. .................................. 324/427; 324/431; 320/48; 340/636
[58] Field of Search ................... 320/48; 324/427, 428, 324/431, 433; 340/636

[56] References Cited

U.S. PATENT DOCUMENTS 3,778,702 12/1973 Finger ................................ 324/29.5
3,971,980 7/1976 Jungfer et al. ...................... 314/29.5
4,558,281 12/1985 Codd et al. ......................... 324/427
4,595,880 6/1986 Patil .................................... 324/431
4,947,123 8/1990 Minezawa ........................... 324/427
4,949,046 8/1990 Seyfang ............................... 324/431
4,952,862 8/1990 Biagetti et al. ....................... 320/48

FOREIGN PATENT DOCUMENTS 0225106 6/1987 European Pat. Off. .
61-109261 3/1986 Japan .
2144863A 3/1885 United Kingdom .
2121971A 1/1984 United Kingdom .
WO8901169 2/1989 WIPO .

OTHER PUBLICATIONS

Translation of Swedish Article entitled "Effective monitoring-Direct identification of battery defects" by Mikael Markow May 1987.
IBM Technical Disclosure Bulletin, vol. 29, No. 1, Jun. 1986, pp. 352–356.

Primary Examiner—Kenneth A. Wieder
Assistant Examiner—Chistopher M. Tobin
Attorney, Agent, or Firm—Young, MacFarlane & Wood

[57] ABSTRACT

A battery monitoring system (10) supplies the user of a battery power system with information indicating the capacity remaining in the battery (9) during discharge. During discharge the system (10) monitors various parameters and calculates on a rapid sampling basis derived parameters from algorithms stored in memory in tabulated form. The recharging efficiency is also evaluated, stored and updated on each charge/discharge cycle so that ageing of the battery (9) is monitored.

3 Claims, 2 Drawing Sheets

BATTERY MONITOR WHICH INDICATES REMAINING CAPACITY BY CONTINUOUSLY MONITORING INSTANTANEOUS POWER CONSUMPTION RELATIVE TO EXPECTED HYPERBOLIC DISCHARGE RATES This is a continuation of application Ser. No. 07/852,193, filed on May 29, 1992, now abandoned.

This invention relates to a battery monitoring system.

In the use of battery operated equipment, such as battery powered electric vehicles and standby power systems, it is desirable to monitor the battery in order to provide from time to time a prediction informing the user of the remaining capacity in the battery.

It is an object of the present invention to provide a battery monitoring system.

According to the present invention a battery monitoring system comprises, first means for evaluating the level of instantaneous current drawn from a battery when supplying a load;

second means for evaluating the level of instantaneous battery voltage;

third means for computing from the output of the first and second means the level of instantaneous power delivered by the battery;

fourth means for determining a final battery voltage level at which the capacity of the battery is exhausted;

fifth means for evaluating from the output of the third and fourth means the estimated final battery current;

sixth means for calculating according to a first predetermined algorithm the total discharge duration of the battery according to the outputs of the fourth and fifth means;

seventh means for calculating according to a second predetermined algorithm the accumulated discharge duration according to the output of the first and second means;

eighth means for assessing the remaining discharge duration available from the battery from the outputs of the sixth and seventh means;

wherein said first predetermined algorithm comprises a hyperbolic equation having first co-efficients selected from a stored table of such first co-efficients by the output of the fourth means, and said second predetermined algorithm comprises a cubic equation having second co-efficients selected from a stored table of such second co-efficients by the output of said first means.

Figure 2:
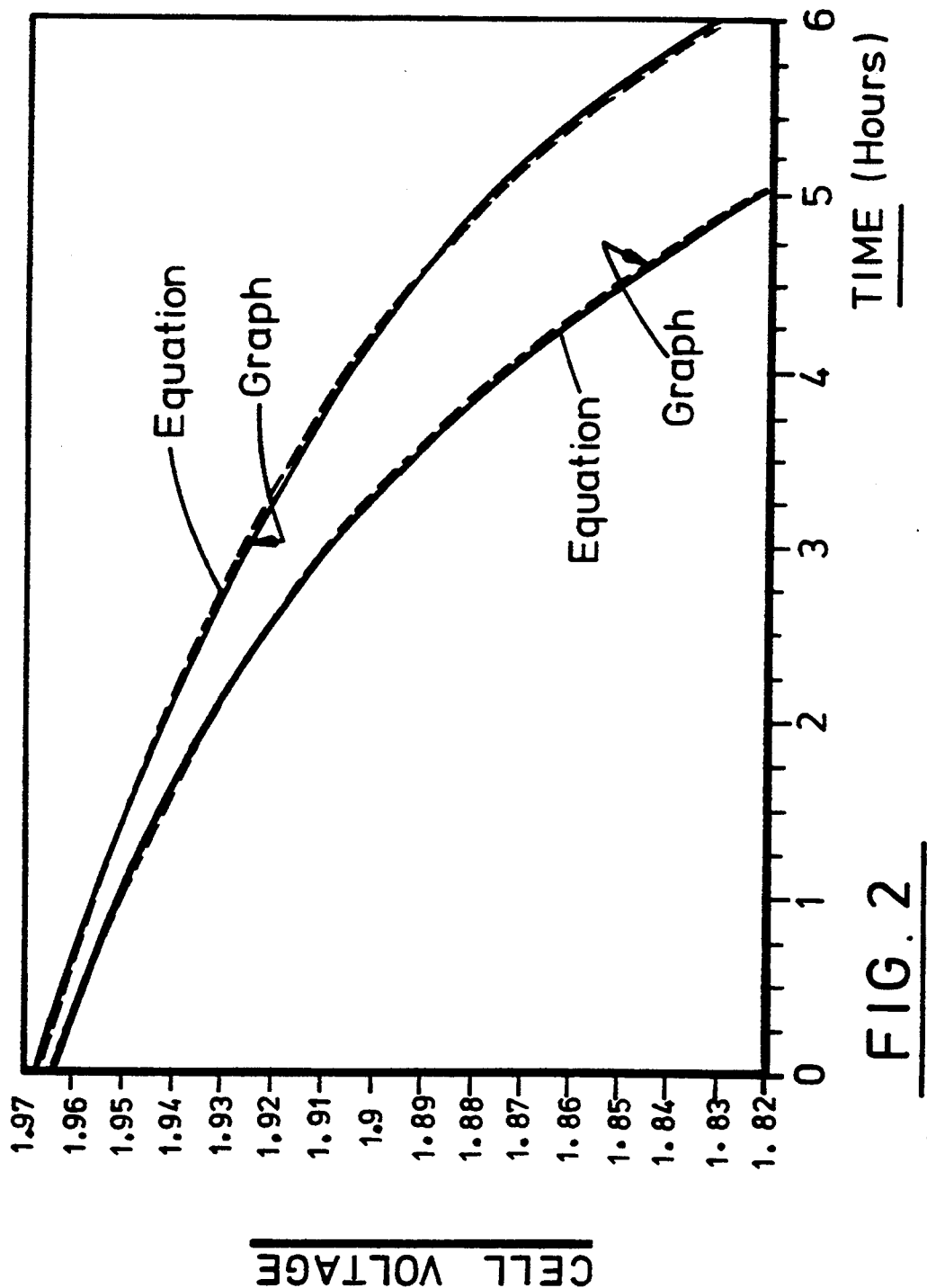

An embodiment of the present invention will now be described with reference to the accompany drawings in which:

FIG. 1 schematically illustrates a battery monitoring system according to the present invention; and FIG. 2 illustrates two typical discharge curves, the upper set of curves illustrating a discharge rate of 15.5% of a 10 hour battery capacity, and the lower set of curves illustrating an 18% discharge rate, the solid lines reflecting data issued by the battery manufacturer and the broken lines reflecting evaluations using the cubic equation of box 17 of FIG. 1.

A battery monitoring system 10 in accordance with the present invention is illustrated in FIG. 1 and monitors the condition of battery 9 which is connected to supply a load 8. System 10 comprises a first evaluating arrangement 11 for evaluating the level of instantaneous current drawn from the battery 9, and a second evaluating arrangement 12 for evaluating the level of instantaneous battery voltage. The outputs of arrangements 11 and 12 are fed to a third arrangement 13 which computes the level of instantaneous power delivered by the battery. A fourth arrangement 14, in this embodiment containing a preset value, determines a final voltage level for the battery 9 when the capacity of the battery is exhausted and the outputs of arrangements 13 and 14 are delivered to a fifth arrangement 15 which evaluates the estimated final battery current. The output of arrangement 15, together with the output of arrangement 14, is delivered to a sixth arrangement 16 for calculating according to a first predetermined algorithm (as will be explained) the total discharge duration of the battery 9.

The outputs of the first and second arrangements 11, 12, in addition to being fed to the third arrangement 13 are fed to a seventh arrangement 17 which is arranged to evaluate according to a second predetermined algorithm (as will be explained) the accumulated discharge duration and the outputs of the sixth and seventh arrangements 16, 17, are fed to an eighth arrangement 18 which evaluates the remaining discharge duration available from the battery 9.

The algorithms which are used in the system 10 are formulated on the basis of the output from first arrangement 11 being in a normalised form, in part this simply being a percentage of the ten hour discharge rate but in part being modified by variations in temperature of the battery 9 with respect to a predetermined temperature (usually 15° C.). Accordingly, a temperature sensor 21 is provided for sensing battery temperature and the output of sensor 21 operates an arrangement 22 to establish a temperature correction factor which is fed to the first arrangement 11. The arrangement 11 therefore comprises a current sensor 11A, a temperature normalising unit 11B and a scaling unit 11C.

The second arrangement 12 comprises a voltage sensor 12A, a stored value, 12B reflecting the number of individual cells within the specific battery 9 and an arithmetic unit 12C which provides the output for arrangement 12 so that the output is measured volts per cell. The third arrangement 13 evaluates the level of instantaneous power delivered by the battery by multiplication of the values delivered to it by the first and second arrangements 11, 12. The fourth arrangement 14 is provided in this example in a present manner, with the final voltage level of each cell and the fifth arrangement 15 contains a calculating unit 15A which by division of the power value delivered to it by arrangement 13 and the voltage measure delivered by arrangement 14 evaluates the final current and this is scaled by unit 15B to the ten hour discharge rate.

The sixth arrangement 16 comprises an arrangement 16A which stores a first set of co-efficients and which is arranged to output a single set of such co-efficients to unit 16B according to the voltage value provided to unit 16A by arrangement 14. Unit 16B is a calculation unit which evaluates a hyperbolic equation having specified co-efficients as delivered by unit 16A and a specified variable as delivered by unit 15B. The evaluation of this hyperbolic equation establishes a total duration of battery discharge.

The seventh arrangement 17 comprises a unit 17A which stores a table of second co-efficients and according to the value of scaled current delivered to it by unit 11C provides a specific set of such second co-efficients to a calculating unit 17B which is arranged to evaluate the accumulated discharge time from a predetermined cubic equation relating instantaneous voltage with accumulated discharge time.

The eighth unit 18 is arranged to subtract the values delivered to it by units 16 and 17 to thereby provide a measure of the remaining time to final discharge of the battery 9. Arrangement 18 may also express the remaining discharge time available as a percentage of the total discharge time or may express the accumulated discharge time as a percentage of the total discharge time.

The cubic equation evaluated by unit 17B is derived from graphical data provided by battery manufacturers expressing the relationship between measured battery voltage and accumulated discharge time for a particular level of instantaneous current. It has been found that the divergence between the graphical data and the cubic equation is minimal as illustrated by FIG. 2 and by storing sets of co-efficients in unit 18A for particular values of current a substantial reduction of storage space is achieved together with an increased ability to interpolate for unstored sets of co-efficients. Likewise the hyperbolic equation evaluated by unit 16B is derived from graphical data provided by battery manufacturers expressing the total discharge period to a particular value of final battery voltage for a series of specific values of instantaneous battery voltage and the divergence between the hyperbolic equation and the graphical data is negligible. Interpolation of unstored co-efficients for the hyperbolic equation is readily effected by unit 16A.

By way of operation of the system 10 a specific example will now be evaluated for a battery of the lead acid HCP17 type having the following parameters:

| | |
|---|---|
| Ampere hour rate | 800 = 10 hour capacity |
| No. of cells | 164 |
| Temperature correction factor | 1% per °C. |
| Rated temperature | 15° C. |
| Final voltage | 294 |
| Final volt/cell | 1.79 |

The following measurements are taken:

| | |
|---|---|
| Current | 146 Amperes |
| Voltage | 314.8 Volts |
| Temperature | 20° C. |

1) Sensor 11A measures the present current ($i_{in}$) flowing through the battery leads as +146 amps, the positive sign indicating that the battery is being discharged.

Unit 11B normalises $i_{in}$ to rated temperature (15° C.) and because the measured temperature in the battery room is 20° C. the temperature correction factor provided by unit 22 is:

$$tempco = 1 + (20 - 15) \times (1/100) = 1.05$$

so that the temperature-corrected discharge current is $146.0 \div 1.05 = 139.05$ Unit 11C calculates current $i_p$ in terms of the 10 hour capacity of the battery, to give a percentage, so that the output of arrangement 11 is:

$$i_p = (139.05 \times 100) \div 800 = 17.38\%$$

2) Sensor 12A measures the battery voltage as 314.8 volts d.c.

Unit 12B divides the battery voltage by the number of cells (164) to give cell voltage:

$$v_{in} = 314.8/164 = 1.9195$$

3) Arrangement 13 calculates power demand.

$$Power = v_{in} \times i_p = 1.9195 \times 139.05 = 266.90 \text{ watts}$$

4) Unit 15A calculates final current $$i_f = power/v_f$$

($v_f$ is the preset final voltage, i.e. 1.79 established in arrangement 14).

$$i_f = 266.90/1.79 = 149.11 \text{ amps}$$

and this is scaled by unit 15B to be 18.64% of the 10 hour capacity.

5) Arrangement 16 calculates the finish time T, using final current ($i_f$) from a hyperbolic equation of the form $$T = a + bi^{-1} + ci_f^{-2}$$

where the hyperbolic co-efficients (a,b,c) are stored in unit 16A for specified final voltage values; e.g.

| Final volts | a | b | c |
|---|---|---|---|
| 1.85 | −111.738 | 6662.29 | 3942.7 |
| 1.83 | −95.1394 | 6645.34 | 5171.71 |
| 1.81 | −87.7079 | 6939.18 | 3580.98 |
| 1.79 | −74.9541 | 6913.18 | 3857.27 |
| 1.77 | −65.1906 | 6880.4 | 4634.92 |
| 1.75 | −56.4163 | 6826.9 | 5202.11 |

From the above table unit 16A selects the co-efficients for the set end point voltage of 1.79:

| | | | |
|---|---|---|---|
| 1.79 | −74.9541 | 6913.18 | 3857.27 | and the finish time T for the specified final current of 18.64% is calculated using the hyperbolic equation:

$$T = -74.9541 + (6913 / 18.64) + (3857.27 / (18.64)^2)$$
$$= 307.06$$

6) Unit 17 calculates the accumulated discharge time t from a cubic equation of the form $$V = a + bt + ct^2 + dt^3$$

where the cubic co-efficients (a,b,c,d) are stored in unit 17A for specified levels of current $i_p$, e.g.

TABLE I

| $i_p$ | a | b | c | d |
|---|---|---|---|---|
| 172 | 1.655 | −4.392 E-3 | 5.426 E-4 | −2.127 E-4 |
| 142 | 1.710 | −5.985 E-3 | −4.174 E-4 | 2.164 E-5 |
| 106 | 1.776 | −4.722 E-3 | 2.348 E-5 | −2.609 E-6 |
| 88 | 1.804 | −2.839 E-3 | −1.082 E-5 | −7.787 E-7 |
| 71 | 1.837 | −1.240 E-3 | −2.965 E-5 | −1.203 E-7 |
| 60 | 1.852 | −7.024 E-2 | −3.478 E-2 | 6.180 E-3 |
| 36.9 | 1.913 | −4.214 E-2 | −4.087 E-3 | 3.903 E-3 |
| 27 | 1.940 | −3.234 E-2 | 5.836 E-3 | −3.533 E-3 |
| 21.6 | 1.951 | −1.648 E-2 | 6.957 E-4 | −1.331 E-3 |
| 18 | 1.964 | −1.382 E-2 | 5.565 E-5 | −5.936 E-4 |
| 17.38 | 1.96496 | −1.432 E-2 | 5.77 E-4 | −5.8 E-4 |
| 15.5 | 1.968 | −1.592 E-2 | 2.232 E-3 | −5.632 E-4 |
| 13.6 | 1.972 | −1.361 E-2 | 2.811 E-3 | −5.399 E-4 |
| 12.1 | 1.977 | −1.277 E-2 | 2.092 E-3 | −3.312 E-4 |
| 11 | 1.982 | −1.310 E-2 | 2.065 E-3 | −2.759 E-4 |
| 10 | 1.986 | −9.299 E-3 | 1.381 E-3 | −1.860 E-4 |

(where E-2 represents $10^{-2}$ etc.) Accordingly the cubic equation is:

$$V = a + b \cdot t + c \cdot t^2 + d \cdot t^3$$

We know the following variables $V$ = cell voltage = 1.9195

$a$ = calculated coefficient = 1.96496

$b$ = calculated coefficient = $-0.01432$ $c$ = calculated coefficient = 0.000577

$d$ = calculated coefficient = $-0.00058$ and unit 17B solves this equation, by iteration, for t, the result being t = 161 minutes.

7) Arrangement 18 evaluates the remaining time as the difference between final time and present time = 307 − 161
= 146 minutes so that if the discharge continues at the present rate the battery will last for a further 146 minutes.

Additionally arrangement 18 may evaluate the percent discharge remaining as (Remaining time/finish time) × 100
= (146/307) × 100
= 47.56% so that the battery has 47.5% of its charge remaining.

It will be appreciated that in the foregoing example, for both the cubic and hyperbolic equations the sets of stored co-efficients and their identifier contain an identifier equal in value to that produced by arrangement 11 and by arrangement 14 but, particularly for arrangement 11 which outputs a measure of instantaneous current which is likely continuously to change, there is no guarantee that the evaluated current value is identical to an identifier within store unit 17A. Accordingly, unit 17A is adapted to interpolate between the nearest stored identifiers and their stored co-efficients to obtain the required identifier and required co-efficients.

For example, in the event that the identifier and its co-efficients are not stored in unit 17A interpolation is made between the co-efficients stored for stored identifier 18.0 and those of stored identifier 15.5 (see the previous Table I) by calculating the ratio that 17.38 is between 15.5 and 18.0 (76%) and for each stored co-efficient evaluating the interpolated value. Thus, taking co-efficient a as the example:

$a$ = (1.964/1.968) × 0.76 + 1.968
= 1.965

Interpolation may be carried out on a similar basis by unit 16A in the case where the final voltage $V_f$ is not a preset value as dictated by the battery manufacturers which is normally a value specifically contained as an identifier in store unit 16A.

It will be understood that in the system 10 which has been described the system outputs on a continuous (very rapid sampling) basis the prediction of the battery capacity remaining at any point in time and this prediction can, if so desired, be used to set or operate alarm devices guarding the battery and load arrangement.

The system 10 may be modified to incorporate a self-learning regime by comparing the projected discharge of the battery 9 with the actual discharge by means of which the system 10 self-adjusts for inefficiencies of the battery and load arrangement and for battery ageing. This is achieved using "electrically erasable programmable read only memory" (EEPROM). Each time a discharge takes place, the system 10 records all the vital parameters and then integrates them with previously stored derived measurements.

For example calculations made during the discharge and recharge of the battery allow the system to calculate the effective "charging efficiency". That is to say the percentage of energy that has to be returned to the battery in order to return it to the fully charged state or to a predetermined percentage thereof. To achieve this the system stores the following data for each charge/discharge cycle:

Battery energy level at end of discharge (EEPD).
Energy returned to battery during recharge (ER).
Battery energy level at start of next discharge (ESND). The charging efficiency can be expressed as:

$$\text{Charge Efficiency (CE)} = \frac{ESND - EEPD}{ER} \times 100$$

The result from each charge/discharge cycle is integrated into a continuous store, the "historical charge efficiency". The system therefore "learns" the charging efficiency of the battery, load and charging unit.

Logging of previous recharge rates, times and efficiencies allow the system to indicate the predicted recharge time required to return the battery to a charged state. In order to calculate the required recharge time the system records one further parameter:

Charge Rate (CR) Expressed in Ampere/minutes and derives

Depth of Discharge (DD) as % Fully Charged energy level

The recharge time then can be expressed as:

$$\text{Charge Time (minutes)} = \frac{DD}{CE} \times \frac{CR}{BC}$$

where BC is the Battery Capacity expressed in Ampere/minutes. All the above variables are stored in electrically erasable programmable read only memory (EEPROM).

I claim:

1. A battery monitoring system comprising:
   current measuring means for evaluating the level of instantaneous current drawn from a battery when supplying a load;
   voltage measuring means for evaluating the level of instantaneous battery voltage when the battery is supplying the load;
   means for selecting a final battery voltage level at which the capacity of the battery is to be considered exhausted; and
   arithmetic means for continuously receiving measurement values outputted from said means and for computing continuously on a rapid sampling basis a measure of remaining battery life;

wherein said arithmetic means comprises:

a first arithmetic unit (13–16) for computing the instantaneous power level delivered by the battery and for evaluating continuously on a rapid sampling basis according to a first predetermined algorithm the total discharge duration (T) available from the battery when continuing to supply power at the measured instantaneous power level based upon the selected final battery voltage level;

a second arithmetic unit (17) for evaluating continuously on a rapid sampling basis according to a second predetermined algorithm a measure of elapsed discharge time (t) from the measured instantaneous battery voltage and battery current;

a third arithmetic unit (18) for evaluating continuously on a rapid sampling basis the remaining life of the battery if it continues to supply power at the measured instantaneous power level, by subtracting the measure evaluated by the second arithmetic unit (17) from that evaluated by the first arithmetic unit (13–16); and wherein (i) said first predetermined algorithm comprises the hyperbolic equation $$T = a + b(i_p)^{-1} + c(i_p)^{-2}$$

where a,b,c are co-efficients which are a function of the final battery voltage level and which are held in sets in a storage table to be outputted according to the selected final battery voltage level; and (i) said second predetermined algorithm comprises the cubic equation $$V = A + Bt + Ct^2 + Dt^3$$

where A,B,C,D are co-efficients which are a function of instantaneous battery current ($i_p$), and which are held in sets in a storage table to be outputted according to the measured value of instantaneous battery current ($i_p$), and V is the measured value of instantaneous battery voltage.

2. A system as claimed in claim 1, wherein a temperature sensor is provided for monitoring battery temperature, the temperature sensor output being connected to the current measuring means to establish a temperature-corrected measure of the instantaneous current drawn from the battery and which temperature-corrected current measure is outputted to the arithmetic means.

3. A system as claimed in claim 2, wherein the first arithmetic unit and the second arithmetic unit each includes interpolation means to establish co-efficients of value intermediate those stored by the respective table.

* * * * *